(12) United States Patent
Perez

(10) Patent No.: US 7,135,912 B2
(45) Date of Patent: Nov. 14, 2006

(54) METHODS AND SYSTEMS FOR DECOUPLING THE STABILIZATION OF TWO LOOPS

(75) Inventor: Raul Alejandro Perez, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/805,812

(22) Filed: Mar. 22, 2004

(65) Prior Publication Data
US 2005/0206444 A1 Sep. 22, 2005

(51) Int. Cl.
*G05F 1/10* (2006.01)
*G05F 3/02* (2006.01)
(52) U.S. Cl. ...................... 327/541; 327/543
(58) Field of Classification Search ................ 327/538, 327/540–541, 543; 323/273, 277, 280
See application file for complete search history.

(56) References Cited

U.S. PATENT DOCUMENTS

| | | | | |
|---|---|---|---|---|
| 4,064,506 A | * | 12/1977 | Cartwright, Jr. ............ 341/135 |
| 5,936,455 A | * | 8/1999 | Kobayashi et al. ......... 327/437 |
| 6,005,378 A | * | 12/1999 | D'Angelo et al. .......... 323/313 |
| 6,556,083 B1 | * | 4/2003 | Kadanka ..................... 330/292 |
| 6,690,147 B1 | * | 2/2004 | Bonto ......................... 323/280 |
| 6,788,143 B1 | * | 9/2004 | Chen .......................... 330/253 |
| 6,806,692 B1 | * | 10/2004 | Lee ............................. 323/277 |
| 6,812,781 B1 | * | 11/2004 | Tsuchiya .................... 327/563 |
| 2003/0030417 A1 | * | 2/2003 | Takabayashi ............... 323/223 |
| 2004/0080352 A1 | * | 4/2004 | Noda et al. ................. 327/321 |

* cited by examiner

*Primary Examiner*—Quan Tra
(74) *Attorney, Agent, or Firm*—William B Kempler; W. James Brady; Frederick J. Telecky, Jr.

(57) ABSTRACT

Circuits and methods for dynamically stabilizing a circuit having a relatively small capacitive load two current loop sub circuits are provided. A main current loop and an associated sensing loop are coupled such that a compensation capacitance supplied to each sub circuit loop individually will remain isolated and will not be cumulative with respect to the remainder of the circuit.

20 Claims, 4 Drawing Sheets

METHODS AND SYSTEMS FOR DECOUPLING THE STABILIZATION OF TWO LOOPS

TECHNICAL FIELD

The invention relates to electronic circuits. More particularly, it relates to methods and circuits for stabilizing two associated current loops within an electronic circuit.

BACKGROUND OF THE INVENTION

Many electronic circuit applications require maintaining the stability of more than one sub circuit loop within a larger circuit. Challenges can arise, however, when the loop stability requirements come into conflict. For example, in some applications it is desirable to use low dropout regulators (LDOs) that have high stability at very low capacitive loads. This is attractive for reducing the cost associated with using additional external components. Also, portable applications require low dropout voltages and very low power consumption in order to accommodate battery-power limitations. A representative example of a low dropout regulator, in this case a PMOS LDO 10 known in the arts is shown in FIG. 1. A common approach to meeting these often conflicting design requirements is to use Miller compensated PMOS LDOs with quiescent current boosting techniques. Referring to FIG. 2, an example of this prior art approach is shown. The circuit 12 uses PMOS transistors to ensure low dropout. Miller compensation adds a compensation capacitor Cc because the load capacitance $C_L$ is not large enough to produce a useable dominant pole. Quiescent current boosting dependent upon sensed current output is used to conserve power under light load conditions. This is but one example of circuitry known in the arts where stability problems addressed by the invention may be used. The examples herein are presented for illustrative purposes and those skilled in the arts will recognize that the invention may be practiced in a variety of contexts requiring the stabilization of two loops.

Given a low dropout regulator (LDO), in this case a PMOS LDO 10, a current sensing circuit 14 is configured to sense the output current and limit the maximum amount of current provided by the LDO 10 in the case of a short circuit at the output, node N1, of the LDO 10. The current sensing circuit 14 is based on the use of a sense FET M2 and a sense resistor $R_s$. The measurement of the voltage drop across the sense resistor $R_s$ is as a proxy for the total output current through the power transistor M3. A pull-up transistor M1 is used to pull up the gate of the power transistor M3 when a comparator 16 has detected that a predetermined threshold of maximum current has been exceeded. A buffer 18 between node N1 and node N3 is used to isolate the gate capacitance of the power transistor M3 from the high impedance at the output of the error amplifier 20. The quiescent current of the buffer 18 is dynamically boosted directly proportional to the current of the load $I_L$ in order to provide for stability. For this reason, the pull-up transistor M1 drain D1 is connected at node N1, because if connected directly to node N3, it would have to fight against the boosted output stage of the buffer 18 to pull the power device M3 gate up under current limit conditions.

By further consideration of FIG. 2 it may be seen that the current limit control loop 12 includes the comparator 16 and pull-up transistor M1, in essence forming a two-stage amplifier circuit. The common method known in the arts for compensating a two-stage amplifier circuit is to use Miller compensation. Adding a compensation capacitor Cx between node N1 and node N2 to compensate the current limit loop 22 is the standard approach. However, this compensation capacitor Cx introduces trade-offs in the performance of the LDO 10.

There are at least two general classes of difficulties with this compensation approach. First, for the purpose of example, it is assumed that the error amplifier 20 has only one gain stage. Using the example of a folded cascode, in this case the Miller compensation splits the poles at node N1, the high impedance node of a folded cascoded amplifier, and node N4. Adding the compensation capacitor Cc between node N1 and node N4 adds to the overall capacitance at the high impedance node N1 of the folded cascode. Assuming that the capacitance Cx used to compensate the current limit loop 22 is smaller than the Miller compensation capacitor Cc used for the LDO loop 10, this increased capacitance reduces the overall slew rate of the amplifier 20. The reduced slew rate is undesirable, as it degrades the transient response of the LDO 10. Alternatively, in an effort to achieve a better Power supply rejection ratio (PSRR) by using compensation to a low impedance node, connecting the compensation capacitor Cc to the source of the common gate transistor in the folded cascode instead of to high impedance node N1, the trade-offs are more severe. Not only does the transient response suffer, but also the LDO 10 may become unstable. It is desirable to keep the capacitance at node N1 to a minimum because the pole at node N1 is not split by Miller compensation. Also, since N1 is a high impedance node, any capacitance may create a significant pole that would degrade stability. In conflict with this consideration, sufficient minimum capacitance is required in order to stabilize the current limit. If the maximum capacitance tolerable for LDO 10 stability and node N1 is smaller than the minimum required capacitance for stability of the current limit, it is impossible to stabilize both simultaneously.

A second set of difficulties arises for a three gain-stage LDO. In this case, we assume for the purposes of example that the error amplifier 20 is a two-stage amplifier, and that node N1 is the second high impedance node of the error amplifier 20. The first high impedance node pole of the amplifier 20 is split by the Miller compensation capacitor Cc. Thus, similar to the case of compensation to a low impedance node as described above, node N1 provides a pole that is not split by the Miller compensation. Thus, it is desirable to keep the capacitance at node N1 at a minimum for LDO 10 stability. On the other hand, sufficient compensation capacitance is required for maintaining current limit loop stability. Again, it may be impossible to compensate both the LDO 10 and current limit loop 22 simultaneously. Additionally, the same trade-offs exist between the degradation of transient response and stability.

One potential solution to these problems using the prior art approach is the addition of a relatively large amount of capacitance at node N2 in an effort to make the pole at this node become dominant. This potential solution is costly in terms of requiring a relatively large die area.

It has been determined that these and other problems result from the fact that the stability of the loops in the circuit are coupled in terms of stability requirements. In this example, the capacitances affecting LDO stability and current limit stability inevitably affect one another. Due to these and other problems, it would be useful and advantageous to decouple the stability requirements of the loops within a circuit having an LDO in particular, and within a circuit having a main loop and a sensing loop in general.

SUMMARY OF THE INVENTION

In carrying out the principles of the present invention, in accordance with preferred embodiments thereof, methods and circuits of the invention provide for the independent stabilization of two loops within a circuit.

According to one aspect of the invention, a method of stabilizing two current loops within a circuit includes the steps of providing a main current loop for supplying current to a load and providing a sensing loop for monitoring the load current. A further step includes coupling the output of the main current loop and the output of the sensing loop such that the capacitances of each loop are isolated from one another. The capacitances of each loop are selected to independently maintained stability within each loop.

According to an additional aspect of the invention, a preferred embodiment is disclosed in which a circuit having a low capacitive load is provided with two stable current loop sub circuits. A main current loop is used to supply current to the load. The main current loop includes a compensation capacitor for maintaining loop stability. A sensing loop monitors the current to the load. The sensing loop has a compensation capacitor for maintaining loop stability. A transistor couples the output of an error amplifier with the output of the sensing loop such that the compensation capacitors of each loop are isolated from one another.

According to yet another aspect of the invention, circuits and methods for stabilizing a circuit having a capacitive load on the order of approximately 1 uF and having two current loop sub circuits are provided. A main current loop provides current to the load. A sensing loop monitors the current. The main current loop and the sensing loop are coupled such that a compensation capacitance supplied to each sub circuit loop individually will remain isolated and will not be cumulative with respect to the remainder of the circuit.

According to still another aspect of the invention, preferred embodiments are implemented to provide low dropout regulator (LDO) circuitry.

The invention provides technical advantages including but not limited to decoupling the stabilization of two loops within a circuit such that the required capacitance is small, and die area is reduced, resulting in some instances in lower costs. The inventions may be used with sensing loops including but not limited to applications requiring current sensing, temperature sensing, or monitoring other circuit parameters. These and other features, advantages, and benefits of the present invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

References in the detailed description correspond to the references in the figures unless otherwise noted. Descriptive and directional terms used in the written description such as first, second, left, right, etc., refer to the drawings themselves as laid out on the paper and not to physical limitations of the invention unless specifically noted. The drawings are not to scale, and some features of embodiments shown and discussed are simplified or amplified for illustrating the principles, features, and advantages of the invention.

DETAILED DESCRIPTION OF PREFERRED EMBODIMENTS

Figure 3:
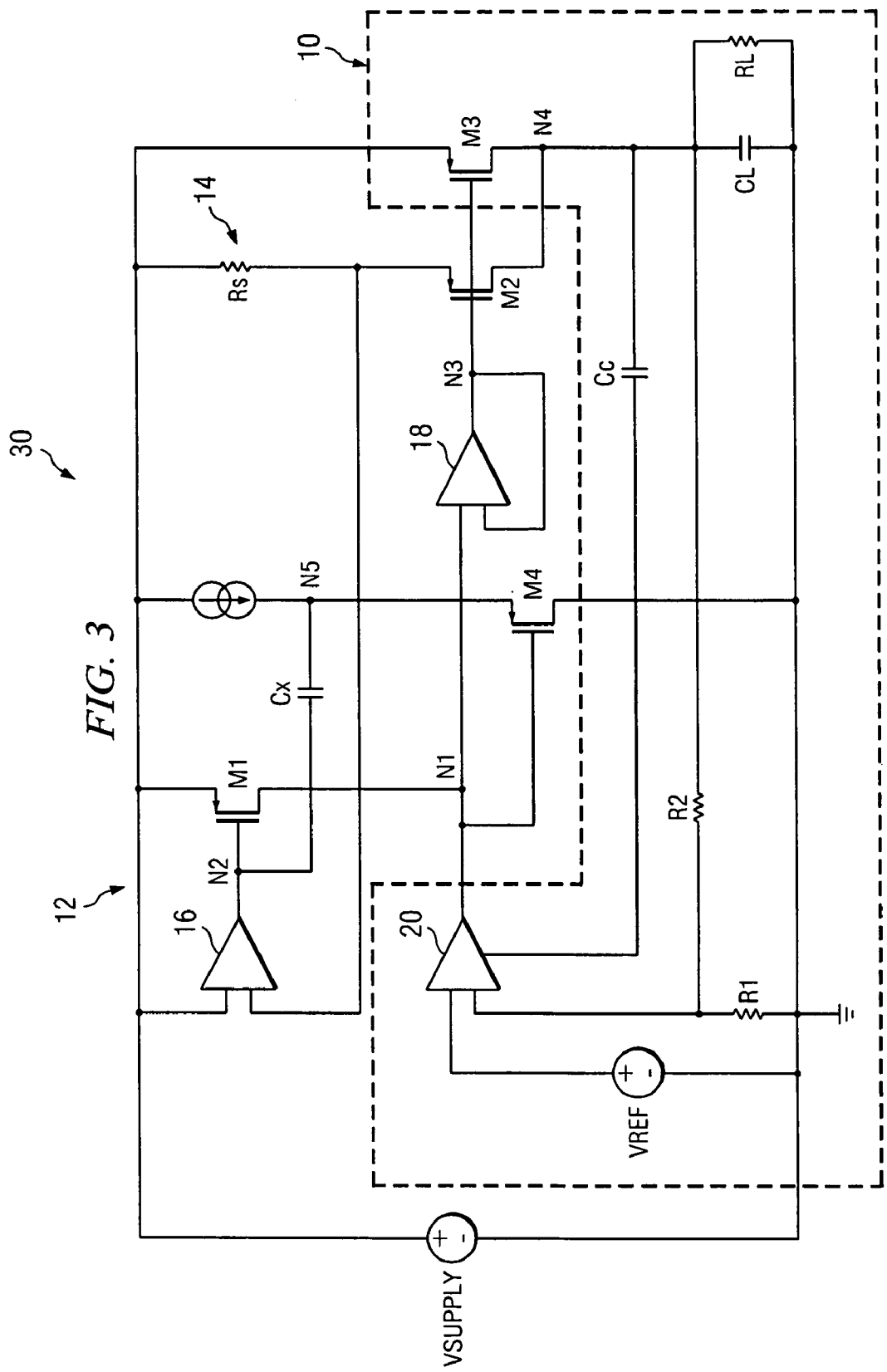
FIG. 3 is a schematic diagram depicting an example of an LDO circuit using a preferred embodiment of the invention.

In general, the invention provides methods and circuits for decoupling the stability characteristics of loops within a circuit. Referring now primarily to FIG. 3, an overview of the methods and circuits of the invention is shown by this example of a schematic diagram of a circuit 30 wherein the stability characteristics of an LDO loop 10 and current limit loop 12 have been decoupled. Transistor M4 is shown coupled between the opamp 20 and buffer 18. The gate is connected to the output of the error amplifier 20, the drain is connected to ground, and the source is connected to node N5. At node N5, a current source is coupled to a power supply and the compensation capacitor Cx of the comparator 16.

Although a specific example of the invention is shown used in an LDO implementation with MOSFET transistors, it should be understood by those skilled in the arts that the invention may be employed in various current loops and using various alternative transistor types, for example, bipolar transistors. Also, the invention may be practiced in other contexts where sensing is required, such as temperature-sensing or motion-sensing circuits, for example. In the circuit configuration 30 shown, the source of transistor M4 and the compensation capacitor Cx of the current limit loop 12 have been connected at node N5. In this arrangement, the stability requirements of the current limit loop 12 and the LDO loop 10 are decoupled. Examining node N1, it may be seen that this node is decoupled by the operation of transistor M4 from the capacitance Cx connected at node N5. Because of this, the capacitance Cx may be increased to any required value for stability of the current limit loop 12 without detracting from the stability or transient response of the LDO loop 10. Transistor M4 is in the OFF state during no-load conditions because the voltage of node N1 tracks the voltage of node N3. The gate voltage of the power transistor M3 is much lower than the M4 device turn-on voltage during no-load conditions. The current limit 12 does not engage in no-load conditions. Thus, compensation of the current limit loop 12 is present only when the current limit engages at a pre-selected current threshold, at which point transistor M4 switches to its ON state as the voltage at node N1 drops sufficiently. Therefore, the stabilization solution of the invention does not require additional quiescent current at no-load. An additional advantage of the invention is that the required compensation capacitance is small due to the Miller effect.

Figure 1:
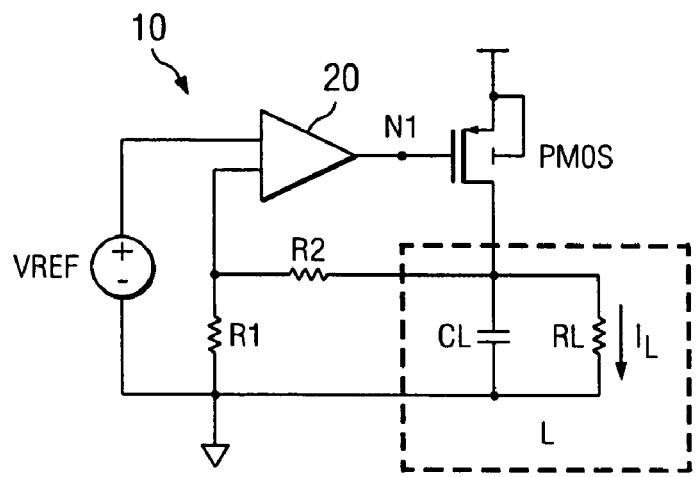
FIG. 1 (prior art) is a schematic diagram showing an example of a PMOS LDO known in the arts for demonstrating an application where a preferred embodiment of the invention may be used.
Figure 4:
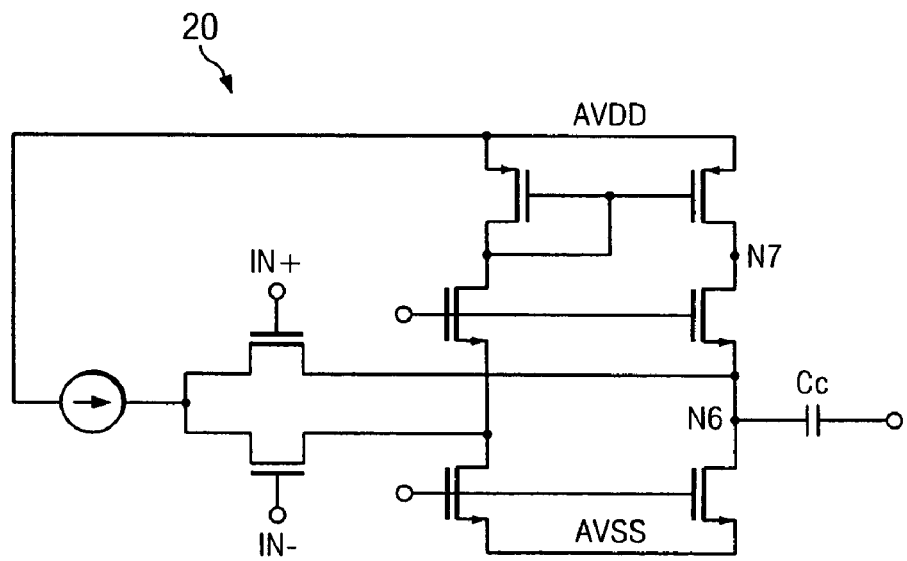
FIG. 4 is a close up schematic diagram of the portion of the circuit of FIG. 3 illustrating an alternative embodiment of the invention.
Figure 2:
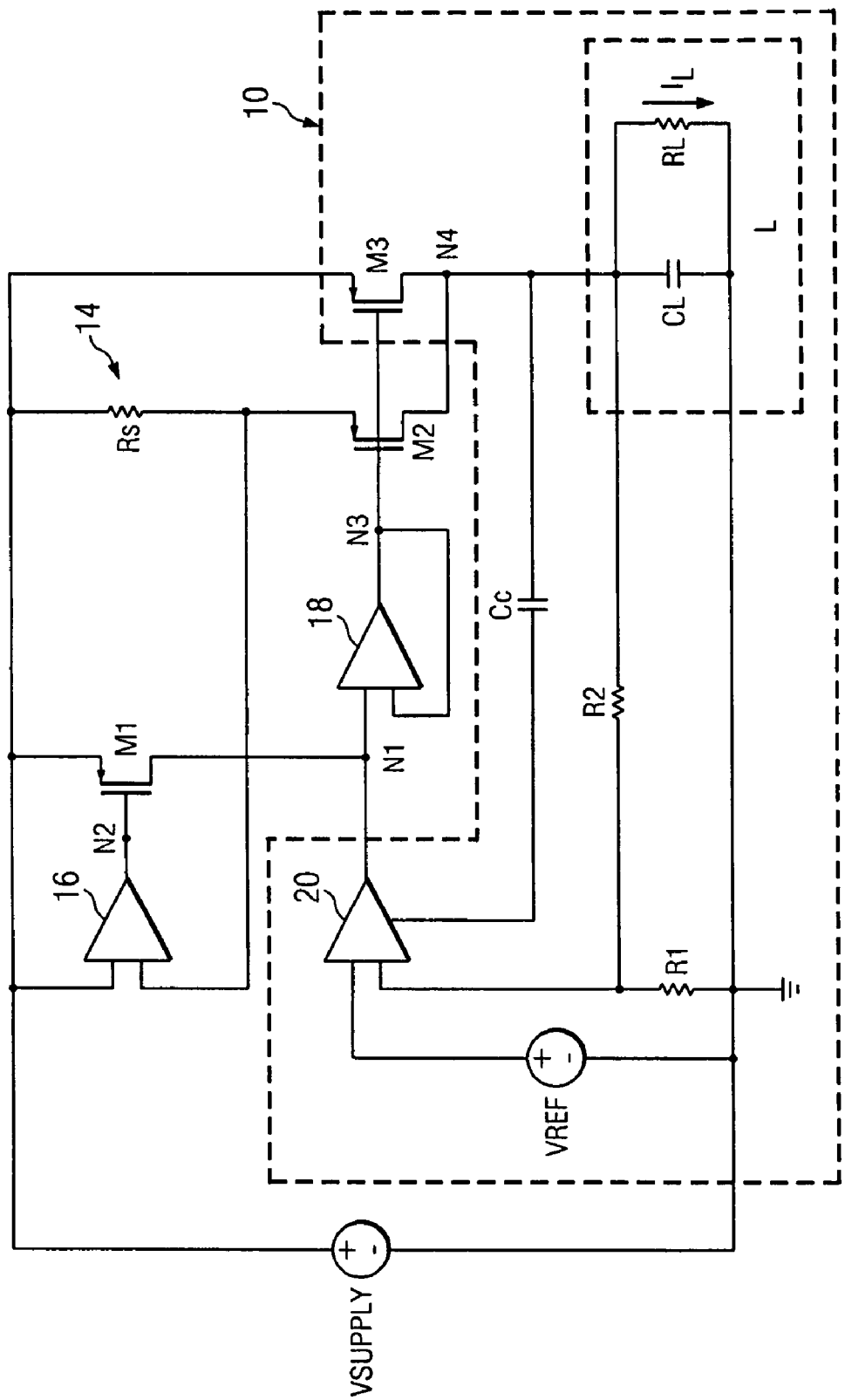
FIG. 2 (prior art) is a schematic diagram illustrating an example of an LDO circuit compensated as known in the arts for further demonstrating an application where a preferred embodiment of the invention may be used.
Figure 5:
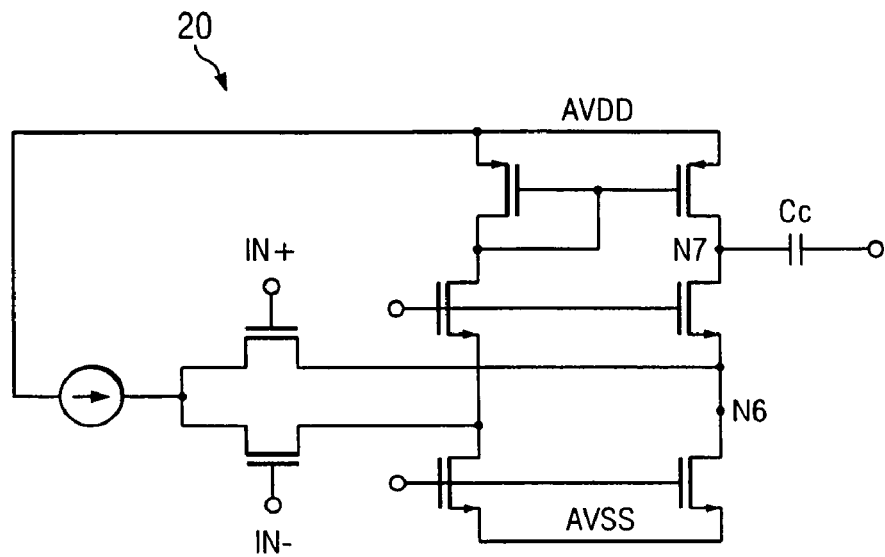
FIG. 5 is a close up schematic diagram of the portion of the circuit of FIG. 3 illustrating an alternative embodiment of the invention.
Figure 6:
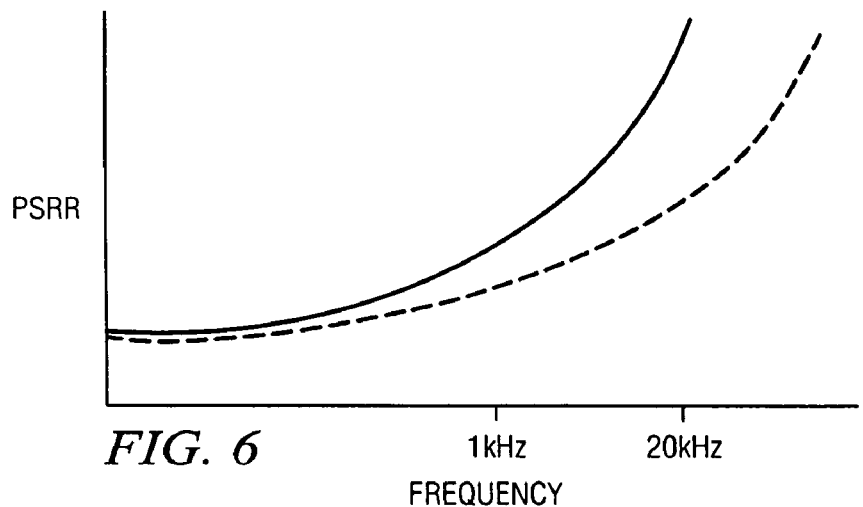
FIG. 6 is a graphical representation of examples of the operation of the methods and circuits of preferred embodiments of the invention.

Close up schematic views of alternative examples of the connection of the compensation capacitor Cc to the error amplifier 20 for use with a preferred embodiment of the invention, e.g. the circuit 30 of FIG. 3, are shown in FIG. 4 and FIG. 5. The two alternative embodiments are shown illustrating that the compensation capacitor Cc may be coupled to the error amplifier 20 at either of two internal nodes, e.g.; N6, N7. Referring first to FIG. 4, preferably the compensation capacitor Cc is coupled to node N6. Node N6 is a low impedance node relative to the surrounding circuitry 20. The embodiment using a coupling to node N6 is preferred since it provides a better power supply rejection ratio (PSRR), as shown in FIG. 6, with improved operation at higher frequencies. FIG. 6 is a graphical representation of the PSRR (y-axis) and frequency (x-axis, kHz) of the embodiments of the invention represented in FIGS. 4 and 5, respectively.

Alternatively, as shown in FIG. 5, the compensation capacitor Cc may be coupled to the error amplifier 20 at its high impedance node N7. Examination of FIG. 4 and FIG. 5 reveals that for the purposes of AC analysis, the coupling to the compensation capacitor Cc in either case functions as a short circuit. As a result, the stabilizing effect of the compensation capacitor Cc is available when needed. The alternative embodiment using node N6 (FIG. 4) offers an improved slew rate over the prior art. This implementation is generally preferred due to the capability of using a smaller capacitor. Slew rate is a function of current divided by capacitance.

Thus, the invention provides improved loop stabilization methods and circuitry with favorable slew rates and PSRRs without the detriment of excessive capacitance due to the compensation requirements of sensing or control loops. While the invention has been described with reference to certain illustrative embodiments, the methods and apparatus described are not intended to be construed in a limiting sense. Various modifications and combinations of the illustrative embodiments as well as other advantages and embodiments of the invention will be apparent to persons skilled in the arts upon reference to the description and claims.

I claim:

1. A method of stabilizing two current loops within a circuit comprising the steps of:
   providing a main current loop utilizing negative feedback for supplying current to a load;
   providing a sensing loop utilizing negative feedback for controlling the current to the load but not supplying current thereto;
   an error amplifier for the main current loop coupled to the output of an error amplifier for the sensing loop such that the capacitance of each loop is isolated from that of the other loop; and
   providing a compensating capacitor to each loop whereby stability is independently maintained for each loop within selected operational criteria.

2. A method according to claim 1 wherein the coupling step further comprises coupling the output of the error amplifier for the sensing loop to the gate of a transistor and coupling the compensating capacitor of the sensing loop to the source of the transistor.

3. A method according to claim 1 wherein the output of the main loop error amplifier comprises a first node having a higher impedance than a second node, the compensating capacitor being coupled to the second node.

4. A method according to claim 1 wherein the output of the main loop error amplifier comprises a first node having a higher impedance than a second node, the compensating capacitor being coupled to the first node.

5. A circuit stabilization method according to claim 1 wherein the main loop further comprises a low dropout regulator (LDO).

6. A circuit having a low capacitive load and comprising two stable current loop sub circuits further comprising:
   a main current loop for supplying current to the load, the main current loop having a negative feed back loop utilizing a first compensation capacitor for maintaining stability within a pre-selected operational range;
   a sensing loop for controlling the current to the load but not supplying current thereto, the sensing loop having a negative feedback loop utilizing a second compensation capacitor for maintaining stability within a pre-selected operational range; and
   a transistor for coupling the output of the main current loop error amplifier and the output of the sensing loop such that the first compensation capacitor is isolated from the second compensation capacitor.

7. A circuit according to claim 6 wherein the transistor further comprises a MOSFET.

8. A circuit according to claim 6 wherein the transistor further comprises a bipolar transistor.

9. A circuit having a low capacitive load and comprising two stable current loop sub circuits further comprising:
   a main current loop for supplying current to the load, the main current loop having a first compensation capacitor for maintaining stability within a pre-selected operational range;
   a sensing loop for controlling the current to the load, the sensing loop having a second compensation capacitor for maintaining stability within a pre-selected operational range; and
   a transistor for coupling the output of the main current loop error amplifier and the output of the sensing loop such that the first compensation capacitor is isolated from the second compensation capacitor, wherein the output of the main current loop error amplifier is coupled to the gate of the transistor and the output of the sensing loop error amplifier is coupled to the source of the transistor via the second compensation capacitor.

10. A circuit according to claim 6 wherein the main loop further comprises a main load error amplifier having a plurality of output nodes and wherein the output of the main loop error amplifier comprises a lower impedance node of the error amplifier.

11. A circuit according to claim 6 wherein the main loop error amplifier further comprises an error amplifier having a plurality of output nodes and wherein the output of the main loop comprises a higher impedance node of the error amplifier.

12. A circuit according to claim 6 wherein the main loop further comprises a low dropout regulator (LDO).

13. A circuit according to claim 6 wherein the load capacitance of the circuit is on the order of approximately 1 uF.

14. A method of stabilization of a circuit having a capacitive load on the order of approximately 1 uF and having two current loop sub circuits comprising the steps of:
   providing a main current loop for supplying current to the load, the main current loop utilizing negative feedback and having a first compensation capacitance for maintaining stability within a pre-selected operational range;
   providing a sensing loop for limiting maximum current to the load but not supplying current thereto, the sensing loop utilizing negative feedback and having a second compensation capacitance for maintaining stability within a pre-selected operational range; and coupling the output of the main current loop error amplifier and the output of the sensing loop error amplifier such that the first compensation capacitance is isolated from the second compensation capacitance.

15. A method of stabilization of a circuit having a capacitive load on the order of approximately 1 uF and having two current loop sub circuits comprising the steps of:

providing a main current loop for supplying current to the load, the main current loop having a first compensation capacitance for maintaining stability within a pre-selected operational range;

providing a sensing loop for limiting maximum current to the load, the sensing loop having a second compensation capacitance for maintaining stability within a pre-selected operational range; and coupling the output of the main current loop error amplifier and the output of the sensing loop error amplifier such that the first compensation capacitance is isolated from the second compensation capacitance, wherein the output of the main current loop is coupled to the gate of a transistor and one terminal of the sensing loop compensation capacitor is coupled to the source of the transistor.

16. The method according to claim 14 wherein the output of the main loop further comprises an error amplifier having a plurality of output nodes and wherein the output of the main loop comprises a lower impedance node of the error amplifier.

17. The method according to claim 14 wherein the main loop further comprises an error amplifier having a plurality of output nodes and wherein the output of the main loop error amplifier comprises a higher impedance node of the error amplifier.

18. The method according to claim 14 used in a low dropout regulator (LDO).

19. The method of claim 1 wherein the sensing loop limits the maximum current to the load.

20. The circuit of claim 6 wherein the sensing loop limits the maximum current to the load.

* * * * *